United States Patent [19]

Brust

[11] Patent Number: 4,831,328
[45] Date of Patent: May 16, 1989

[54] MEASUREMENT PROCESSING ARRANGEMENT

[76] Inventor: Hans-Detlef Brust, Martin-Luther Strasse 2 D6602, Dudweiler, Fed. Rep. of Germany

[21] Appl. No.: 52,375

[22] Filed: May 21, 1987

[30] Foreign Application Priority Data

May 21, 1986 [DE] Fed. Rep. of Germany ....... 3617044

[51] Int. Cl.$^4$ ...................... G01R 31/26; G01N 23/00
[52] U.S. Cl. ........................... 324/158 R; 324/158 D; 324/73 R; 250/310; 250/311
[58] Field of Search ............ 364/487; 324/77 E, 77 F, 324/158 R, 158 D; 250/310, 311

[56] References Cited

U.S. PATENT DOCUMENTS

| | | | |
|---|---|---|---|
| 3,155,912 | 11/1964 | Applebaum et al. | 324/77 E |
| 3,731,526 | 5/1973 | Games | 324/77 E |
| 3,919,550 | 11/1975 | Banbury | 250/311 X |
| 4,486,660 | 12/1984 | Feuerbaum | 324/158 R X |
| 4,581,534 | 4/1986 | Todokoro et al. | 250/310 X |

FOREIGN PATENT DOCUMENTS

3138992A1  4/1983  Fed. Rep. of Germany .

OTHER PUBLICATIONS

V. H. Rehme, "Elektronenstrahl-Besstechnik zur Pruefung integrierter Schaltungen", Phys. Bl. 38, Nr. 8, 1982, pp. 253–258.

H. P. Feuerbaum, "Electron Beam Testing: Methods and Applications", Scanning, vol. 5, 1983, pp. 14–24.

"Model 162 Boxcar Averager Operating and Service Manual" Cover EG&G Princeton Applied Research cover.

T. Sano et al., "A Multi-Sampling Waveform Measurement Method in the EB Tester", Proc. XIth Int. Cong. on Electron Microcopy, Kyoto 1986, pp. 633–634.

Primary Examiner—Reinhard J. Eisenzopf
Assistant Examiner—Vinh P. Nguyen
Attorney, Agent, or Firm—Hill, Van Santen, Steadman & Simpson

[57] ABSTRACT

A measurement processing arrangement for processing of signal curves of periodic high frequency measured signals through parallel measurement processing units include n number of preceding gate circuits which periodically process n number of chronologically offset measured signals and form n averages over m number of respective samples.

7 Claims, 3 Drawing Sheets

MEASUREMENT PROCESSING ARRANGEMENT

BACKGROUND OF THE INVENTION

1. Field of the Invention

The present invention relates generally to a measurement processing arrangement for measuring high frequency periodic measured signal curves.

2. Description of the Related Art

Sampling methods or a combination of sampling and averaging methods is often used for measuring signal curves of periodic, high-frequency signals. The sampling method provides a high time resolution since chronologically offset segments are taken from a series of periods and combined in a slower, new signal having the same shape. The averaging method, on the other hand, provides good signal-to-noise ratios since the measured value is multiply sampled over a series of periods and then averaged. Both the sampling method and the averaging method are used in oscilloscope technology, as well as in electron beam testing. In electron beam testing technology, electrical voltages at the surface of an integrated circuit are imaged and measured. Most integrated circuits must be dynamically tested, which means that they are operated at nominal frequencies during the testing investigation.

The starting point of the development of electron beam testing is documented in "Voltage Contrast" from Phys. B. 38 (1982), No. 8, Elektronenstrahl-Messtechnik zur Pruefung integrierter Schaltungen, by Hans Rehme. In a scanning electron microscope, a primary electron beam is scanned across the surface of a specimen to be imaged through the use of deflection coils. A detector senses secondary electrons triggered by the primary electron beam, and measurement processing arrangements connected at the output of the detector use the measured signals to modulate the intensity of a picture screen.

Circuit arrangements, known as boxcar integrators, are used in electron beam testing for the combination of sampling and averaging methods. The use of boxcar integrators is shown in U.S. Pat. No. 4,486,660, entitled "Electron Beam Testing Device for Stroboscopic Measurement of High-Frequency Periodic Events". The boxcar integrator is essentially composed of a phase control unit, a delay unit, a gate circuit, and a measurement processing unit.

A block diagram of a boxcar integrator, as well as its interconnection in an electron beam testing apparatus, is shown in FIG. 10 on page 20 of the periodical Scanning, Vol. 5 14/24 (1983) of the article entitled "Electron Beam Testing: Methods and Applications", by H.P. Feuerbaum. An example of a boxcar integrator which works in a combined sampling and averaging method is Model 162 from Princeton Applied Research (see Model 162 Boxcar Averager EG & G, Princeton Applied Research Operating and Service Manual).

In German Published Application No. DE 31 38 992 Al, is disclosed a sampling method for fast voltage measurement in electron beam testing technology. The fast voltage measurement is achieved by multiply sampling the signal curve by a pulsed electron beam during a period of the periodic signal curve. However, the German Application No. DE 31 38 992 Al does not disclose any particulars as to how the sampling method is to be implemented. Moreover, it is limited exclusively to electron beam testing technology.

A disadvantage in the use of boxcar integrators as hitherto employed is that the high measuring time is derived from the maximum measuring rate of the boxcar and from the sampling method. In the sampling method, n sampling points are measured in n periods of the measured signal. Spacing between the zero crossing axis of the measured signal and the sampling point changes with an increasing number of sampling points. In the sampling and averaging method, the time interval over which the signal is to be measured is divided into n generally equidistant sampling points and the measured signal is sampled m times for every sampling point. This operation is repeated for the next sampling point, so that the measuring time amounts $$\text{to } n \cdot m \frac{1}{\max \cdot \text{measuring rate}}$$

$$\left(\text{where } \frac{1}{\max \cdot \text{measuring rate}} \geq T;\right.$$

(where T being equal to the period of the measured signal). In measurements of extremely fast signals using extremely short electron pulses, a greater number of measurements must be carried out, which leads to measuring times spanning a number of minutes. Due to the instability of the measuring equipment and to the phenomena of drift, such long measuring times lead to extremely high measuring errors.

SUMMARY OF THE INVENTION

An object of the invention is to provide considerably reduced measuring times when using sampling methods or sampling and averaging methods during signal measurements.

A further object of the invention is to provide a measurement processing arrangement which is universally employable in, for example, electron beam testing technology or in oscilloscope technology.

These and other objects are achieved in a measurement processing arrangement having a boxcar unit containing parallel connected measurement processing units preceded by gate units for processing chronologically offset measured signals.

When an actual voltage level is to be discerned in electron beam testing technology in addition to a more qualitative voltage contrast signal, then a control unit, and in particular, a sampled-data feedback control unit, is provided. A respective output of one of the measurement processing units is connected to a respective control unit followed by a gate circuit that includes an output, an input, and a control input. All outputs of the gate circuits are connected in common to a spectrometer, such as a opposing field spectrometer. The control input of a first one of the gate circuits is connected to a control input of a corresponding second gate circuit, and the control inputs of others of the gate circuits are correspondingly connected to the control inputs of others of the second gate circuits.

To adapt the measurement processing arrangement of the present invention to the measuring times, each of the measurement processing units has an integrator stage which performs an averaging function. In an alternate embodiment for extremely short measuring times, each of the measurement processing units has a counter stage which counts the short measured signals to be measured.

DESCRIPTION OF THE PREFERRED EMBODIMENTS

Figure 1:
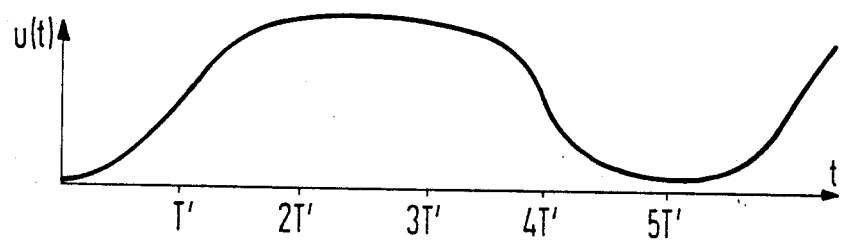
FIG. 1 is a graph of a periodically occurring voltage signal U(t) to be measured with a measurement processing arrangement according to the principles of the present invention.
Figure 2:
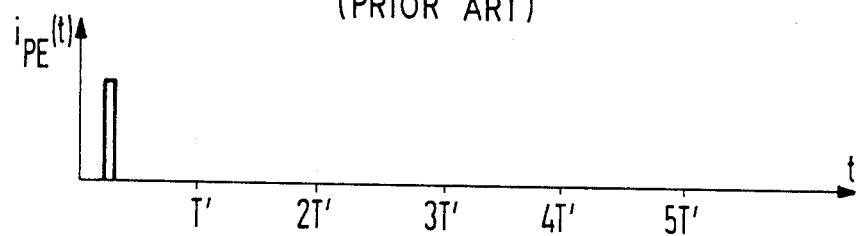
FIG. 2 is a graph of the primary electron beam current in a traditional measuring method.

Referring first to FIG. 1, a periodic voltage U(t) to be measured is shown. The period of the periodic voltage U(t) has a duration of T=5T'. In FIG. 2, a traditional measurement includes a trigger event which leads to a new measurement only after a time $$t' = \frac{1}{\text{measuring rate}}$$

(usually 1 microsecond) following the last measurement. To this end, the primary electron beam $i_{PE}(t)$ is keyed, or unblanked, at most once in the signal period T and the secondary electron current is subsequently measured.

Figure 3:
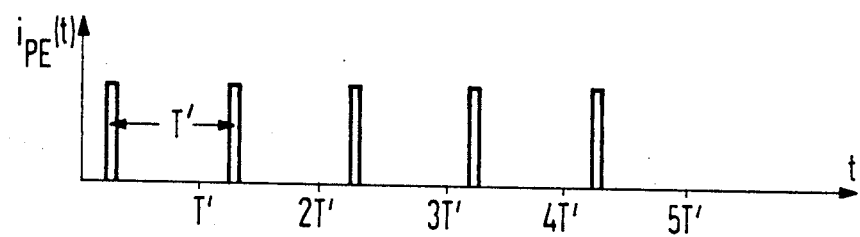
FIG. 3 is a graph of the primary electron beam current in accordance with a measurement carried out by an arrangement of the present invention.

Referring to FIG. 3, a measurement carried out in accordance with the present invention provides a plurality of measurements in response to a trigger event, instead of only one measurement. In the illustrated embodiment, five measurements are shown. To this end, the primary electron beam $i_{PE}(t)$ is multiply keyed five times and the secondary electron current is measured a corresponding number of times.

In the measurement processing arrangement of the invention, delay elements are connected following one another. The delay elements, first, control the multiple keying of the primary electron beam during a signal period and, second, apply the measured signal to the measurement processing units connected in parallel. The measured signals are applied to the measurement processing units chronologically offset by the use of gate circuits. In the measurement processing units, an n number of measured signals are periodically processed and n number of averages are formed over m number of samplings each. For a good signal-to-noise ratio, m=1 so that the n number of measured values are not formed over n number of averages in this case.

Figure 4:
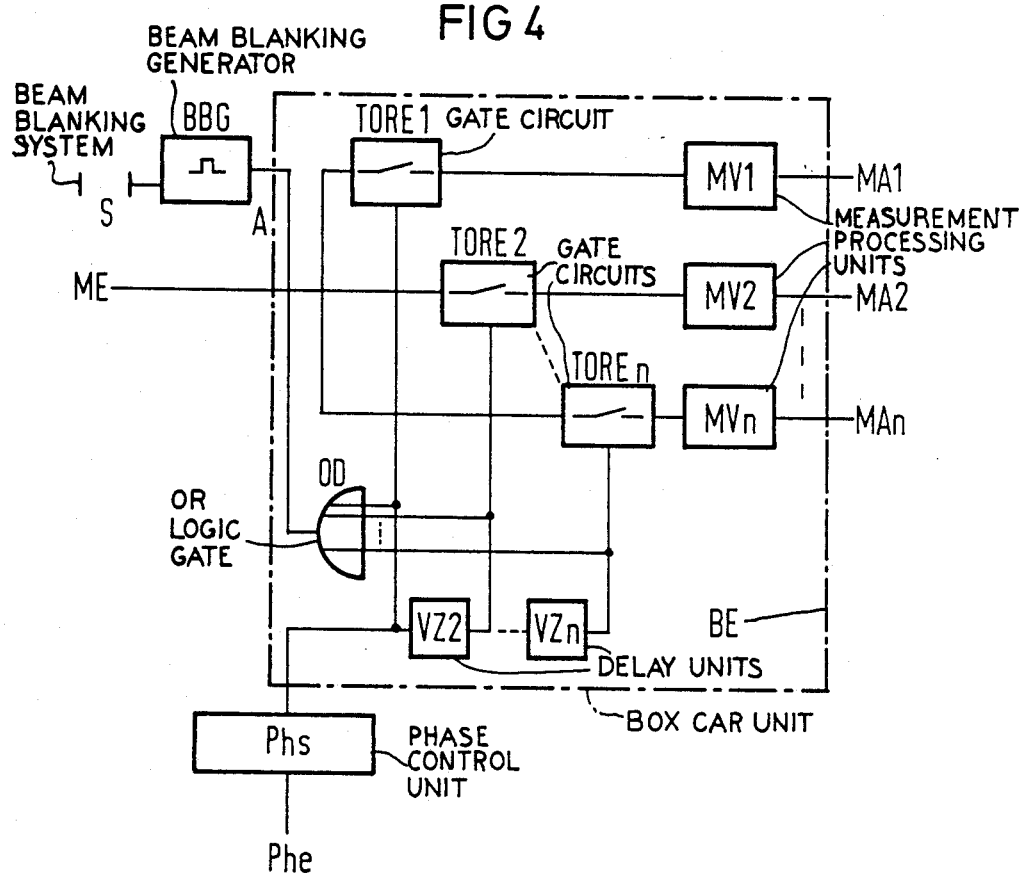
FIG. 4 is a functional block diagram of a measurement processing arrangement of the present invention for particle radiation and including a beam blanking generator and a beam blanking system.

In FIG. 4, a measurement processing arrangement of the invention for particle radiation is formed of a boxcar unit BE including a measurement input ME and trigger input Phe. An output A is provided for connection to a beam blanking generator BBG having a following beam blanking system S. Measurement outputs MA1, MA2 . . . MAn are also provided. The trigger input Phe is connected to a phase control unit Phs. Further trigger signals, each time shifted by a time T, are derived from a trigger signal at the output of the phase control Phs, for example, with the use of series connected delay elements. The further trigger signals then drive the beam blanking system S through the beam blanking generator BBG and generate the primary electron beam pulses. The output of the phase control Phs is also connected to an input of an OR logic gate OD having n number of inputs. The output of the phase control may also be connected to a control input for a gate circuit TORE1 through a further delay unit for equalization with the electron travel time.

Outputs of delay units VZ2, VZ3 . . . VZn are correspondingly connected to the inputs of the OR gate OD and to the control inputs of the gate circuits TORE2 . . . TOREn. The beam blanking generator BBG is directly driven by the output of the OR gate OD. The measured signal is applied to one of the measurement processing units MV1, MV2 . . . or MVn through the input ME and the n parallel gate circuits TORE1, TORE2 . . . TOREn, depending upon the signals at the control inputs of the gate circuits. The measurement processing units MV1 through MVn are formed either of an integrator stage or of a counter stage. The outputs of the measurement processing units MV1-MVn form the outputs MA1-MAn of the boxcar unit BE from which the measured signals are taken.

Figure 5:
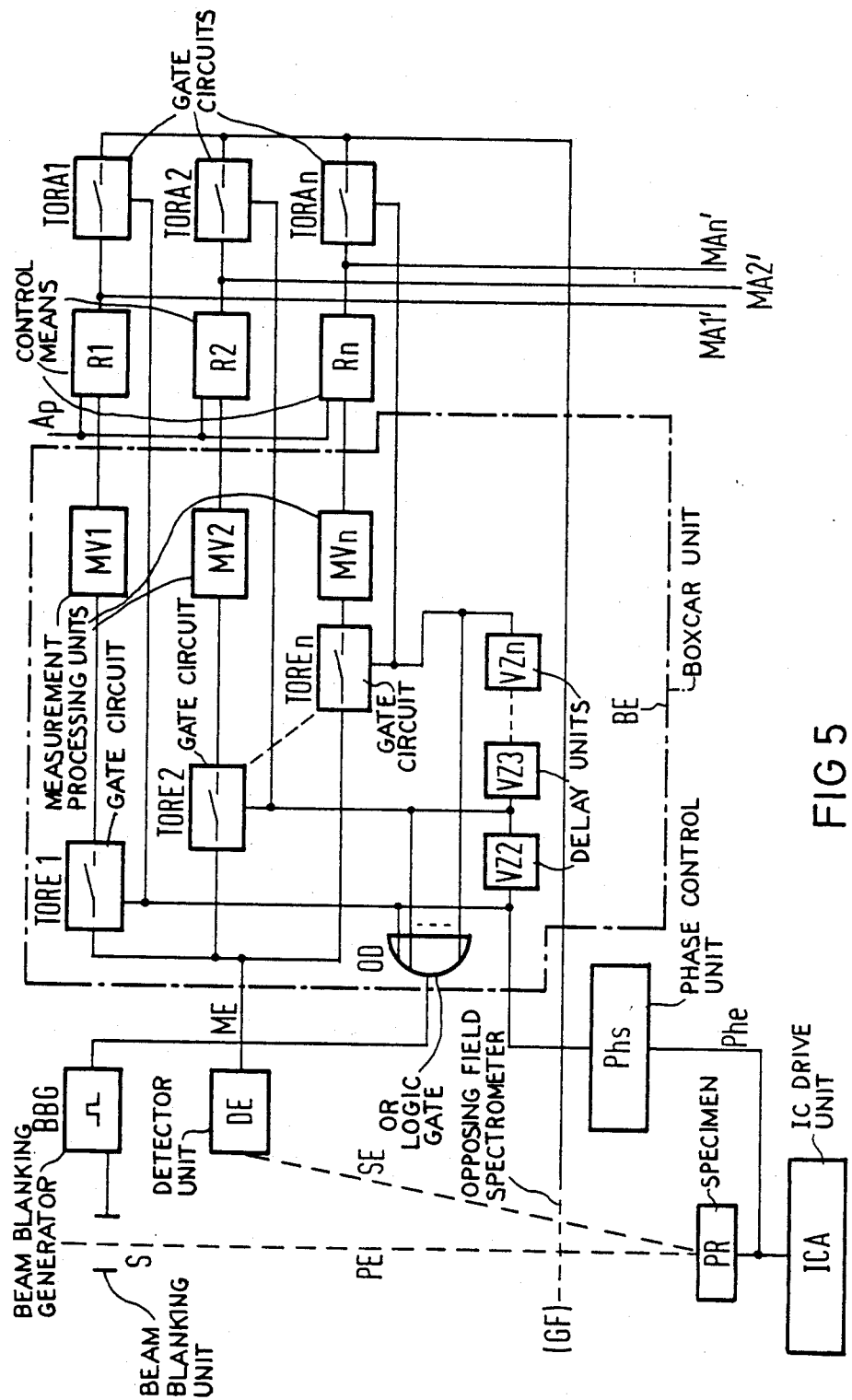
FIG. 5 is a functional block diagram of an electron beam testing apparatus including a feedback measurement processing arrangement for particle radiation.

In FIG. 5, an electron beam measuring apparatus is shown including a feedback measurement processing arrangement for particle radiation. The boxcar unit BE in FIG. 5 corresponds to the boxcar unit BE from FIG. 4. The basic unit of the electron beam testing apparatus is formed by a scanning electron microscope having a beam blanking system S. The primary electron beam PE triggers secondary electrons SE at a specimen PR and the secondary electrons SE are detected by a detector unit DE. The detector unit DE, for example, is formed of a scintillator-photomultiplier combination or, where faster detection systems are required, of a channel-plate or a semiconductor detector. The specimen PR, which is usually an integrated circuit, is connected to an IC drive unit ICA which supplies the specimen PR with test signals.

The electron beam testing apparatus includes a feedback measurement processing arrangement which also includes an opposing field spectrometer GF and n number of parallel connected control means R1, R2 . . . Rn, each having a following gate circuit TORA1, TORA2 . . . TORAn. The rated value of the operating point AP is supplied in common to every controller means R1, R2 . . . Rn through a second input. The actual value of the measured signal is fed into the control means R1 through Rn at a second input. To that end, the output of the measurement processing unit MV1 is connected to the actual value input of the control means R1; correspondingly, the measurement processing units MV2 through MVn are connected to the control means R2 through Rn.

The outputs of the gate circuits TORA1, TORA2 . . . TORAn are connected directly to the opposing field spectrometer GF. Since the n number of measured values are allocated to n number of samples, the gate circuits TORE1 and TORA1 are synchronously operated. To achieve this, the control inputs of the two gate circuits TORA1 and TORE1 are connected in common. This is also true for the gate circuits TORE2 through TOREn and the gate circuits TORA2 through TORAn, respectively.

The feedback measurement processing arrangement functions such that the voltage at the opposing field spectrometer GF is followed up dependent on the measuring point potential so that the current from the secondary electrons SE remains constant.

As in FIG. 4, the boxcar unit BE of FIG. 5 has two inputs, a measuring input ME connected to the detector unit, and a trigger input Phe which is connected to the specimen drive circuit ICA. It is possible to take the processed measured signals at the outputs MA1', MA2'. . . MAn' of the boxcar unit BE; however, the processed measured signals, for example, are connected to a computer.

Although the exemplary embodiments set forth hereinabove are described in conjunction with an scanning electron microscope, the invention can be used with ions, photons, or other particles instead of only electrons, both as primary particles as well as secondary particles. Furthermore, the measurement processing arrangement can be utilized anywhere that measuring times are to be reduced in sampling or sampling and averaging methods. Thus, the present apparatus is not limited simply to electron beam measuring technology and oscilloscope measuring technology.

Although other modifications and changes may be suggested by those skilled in the art, it is the intention of the inventor to embody within the patent warrented hereon all changes and modifications as reasonably and properly come within the scope of his contribution to the art.

I claim as my invention:

1. A measurement processing arrangement for measurement processing of signal curves of high frequency periodic signals, comprising:
   a phase control;
   a boxcar unit including n number of measurement processing units connected in parallel and a delay unit composed of (n−1) delay elements, and
   n number of first gate circuits connected so that each of said measurement processing units is preceded by one of said first gate circuits
   an output of said phase control connected to a control input of one of said first gate circuits and to an input of said delay unit; and
   outputs of said (n-1) delay elements being individually connected to control inputs of the (n-1) remaining ones of said first gate circuits.

2. A measurement processing arrangement as claimed in claim 1, further comprising:
   a beam blanking system including a beam blanking generator for controlling a particle beam, said beam blanking system connected to said boxcar unit.

3. A measurement processing arrangement as claimed in claim 2, wherein said boxcar unit includes:
   an OR logic gate having n number of inputs;
   said phase control having an output connected to an input of said OR logic gate;
   said delay elements having outputs connected to corresponding inputs of said OR gate;
   an output of said OR logic gate connected to said beam blanking generator to blank a particle beam.

4. A measurement processing arrangement as claimed in claim 1, further comprising:
   a plurality of controller units connected to respective outputs of said measurement processing units;
   a plurality of second gate circuits each having an input, an output and a control input connected following said controller units;
   a spectrometer connected in common to all outputs of said second gate circuits; and
   said first gate circuits having said control inputs connected to corresponding control inputs of said second gate circuits.

5. A measurement processing arrangement as claimed in claim 4, wherein said controller units each is defined as controller means for comparing a rated operating point and an actual measured value to be processed.

6. A measurement processing arrangement as claimed in claim 1, wherein said measurement processing units each are formed of an integrator stage for performing averaging functions.

7. A measurement processing arrangement as claimed in claim 1, wherein said measurement processing units each are formed of a counter stage for counting short measured signals to be measured.

* * * * *